US012750009B2

(12) United States Patent
Spina et al.

(10) Patent No.: US 12,750,009 B2
(45) Date of Patent: Sep. 29, 2026

(54) RECEIVER CIRCUIT, CORRESPONDING SYSTEM AND METHOD

(71) Applicant: STMicroelectronics International N.V., Geneva (CH)

(72) Inventors: Nunzio Spina, Catania (IT); Alessandro Castorina, Acireale (IT); Giuseppe Palmisano, S. Giovanni la Punta (IT)

(73) Assignee: STMicroelectronics International N.V., Geneva (CH)

( * ) Notice: Subject to any disclaimer, the term of this patent is extended or adjusted under 35 U.S.C. 154(b) by 365 days.

(21) Appl. No.: 18/409,527

(22) Filed: Jan. 10, 2024

(65) Prior Publication Data

US 2024/0243698 A1 Jul. 18, 2024

(30) Foreign Application Priority Data

Jan. 16, 2023 (IT) ........................ 102023000000495

(51) Int. Cl.
*H03F 3/45* (2006.01)
*H03F 1/02* (2006.01)
*H03K 5/24* (2006.01)

(52) U.S. Cl.
CPC ....... *H03F 1/0233* (2013.01); *H03F 3/45475* (2013.01); *H03K 5/24* (2013.01); *H03F 2200/105* (2013.01)

(58) Field of Classification Search
CPC .................................... H03F 3/45; H03F 3/38
USPC .................................................... 330/253, 10
See application file for complete search history.

(56) References Cited

U.S. PATENT DOCUMENTS 6,249,556 B1 6/2001 Rees et al.
2008/0297246 A1* 12/2008 Taylor .................. H04L 27/361 330/136
2015/0091630 A1* 4/2015 Chandernagor ... H04B 10/6933 327/307

FOREIGN PATENT DOCUMENTS

CN 114884522 A 8/2022
WO 2007088127 A2 8/2007

OTHER PUBLICATIONS

IT Search Report and Written Opinion for priority application, IT Appl. No. 102023000000495, report dated Jun. 28, 2023, 8 pgs.

* cited by examiner

*Primary Examiner* — Henry Choe
(74) *Attorney, Agent, or Firm* — Crowe & Dunlevy LLC

(57) ABSTRACT

An envelope detector receives a modulated signal and a differential stage coupled to the detector produces a replica modulated signal compared to produce a PWM-modulated signal having on and off times. A first switch is actuated to short-circuit the input to the envelope detector. A second switch is actuated to feed back to a storage capacitor a signal indicative of the difference between inputs to the differential stage. A third switch is actuated to short-circuit an input to the comparator. Logic circuitry activates the switched to implement offset compensation where: the first, second and third switches are actuated in the absence of the PWM-modulated signal during start-up and standby phases; and the first, second and third switches are actuated during off times of the PWM-modulated signal in a working phase alternating with the start-up/standby phases.

19 Claims, 5 Drawing Sheets

RECEIVER CIRCUIT, CORRESPONDING SYSTEM AND METHOD

PRIORITY CLAIM

This application claims the priority benefit of Italian Application for Patent No. 102023000000495 filed on Jan. 16, 2023, the content of which is hereby incorporated by reference in its entirety to the maximum extent allowable by law.

TECHNICAL FIELD

The description relates to signal transmission.

Solutions as described herein can be applied, for instance, to transmission of signals between semiconductor chips or dice (oftentimes referred to as inter-chip data communication).

Gate drivers (e.g., for electric motor control), galvanically isolated interfaces, medical equipment, sensor networks and data communications in general are exemplary of possible applications of solutions as described herein.

BACKGROUND

Inter-chip data communication may involve transmitting a modulated radio-frequency, RF carrier between two (integrated circuit) semiconductors chips or dice: as used therein chip/chips and die/dice will be regarded as synonyms.

This type of communication may involve transmitting a low-level RF signal that is rectified at the receiver (e.g., via an envelope detector) and then amplified to be converted into a digital pulse-width modulated (PWM) signal. A final conversion (to recover output data that replicate the transmitted data) can be performed via a hysteresis comparator.

Offset phenomena such as, e.g., an offset voltage between the two inputs of a first amplifier in the receiver can adversely affect correct recovery of the PWM signal.

Adequate offset compensation is thus desirable in order to facilitate accurate demodulation at the receiver.

There is a need in the art to address the issues discussed above.

SUMMARY

One or more embodiments relate to a receiver circuit.

One or more embodiments relate to a corresponding system. A system comprising two or more (integrated circuit) inter-communicating semiconductor chips or dice is exemplary of such system.

One or more embodiments relate to a corresponding method.

Solutions as described herein provide a self-calibration technique for offset compensation in an amplitude-shift keying (ASK) receiver wherein a low-level baseband signal is amplified.

Solutions as described herein involve a dynamic approach that facilitates dynamically compensating also an offset drift induced by a temperature change.

Solutions as described herein do not involve external or non-standard components and are suitable for implementation via CMOS integration technology (e.g., GaN or SiC technology for power MOSFET transistors).

Solutions as described herein provide a fully integrated solution for automatic and accurate analog self-calibration wherein manual and/or preliminary setting can be dispensed with.

Solutions as described herein do not involve an increased power consumption and can be implemented with negligible area occupation.

Solutions as described herein facilitate achieving package scale isolation with galvanic isolation implemented without using specific high-voltage (HV) components.

Solutions as described herein facilitate providing an inter-chip communication channel implemented via wireless RF transmission.

A judicious selection of the distance between two chips facilitates achieving higher isolation ratings (10-12 kV for reinforced isolation) and higher CMTI (>100 kV). In this context, common mode transient immunity (CMTI) is defined as the maximum tolerable rate of rise or fall of a common mode voltage applied between two isolated circuits.

This greatly facilitates arranging two inter communicating chips or dice on two neighboring die pads in a same leadframe packaged in a same body of molding compound (package scale isolation).

Solutions as described herein employ a simple approach that can be adapted easily to different applications, offset values, and accuracy levels with a procedure that can start automatically at start-up.

Solutions as described herein provide a self-calibration technique for offset compensation in an, e.g., ASK receiver where a low base-band signal is amplified by adopting an analog dynamic approach that facilitates dynamically compensating offset drifts induced by temperature.

BRIEF DESCRIPTION OF THE DRAWINGS

One or more embodiments will now be described, by way of example only, with reference to the annexed figures, wherein.

DETAILED DESCRIPTION

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

In the ensuing description one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

For simplicity and ease of explanation, throughout this description, and unless the context indicates otherwise, like parts or elements are indicated in the various figures with like reference signs, and a corresponding description will not be repeated for each and every figure.

Also, throughout this description, a same designation may be used for brevity to designate: a certain node or line and a signal occurring at that node or line, and/or a certain component (e.g., a capacitor or a resistor) and an electrical parameter thereof (e.g., capacitance or resistance/impedance).

Figure 1:
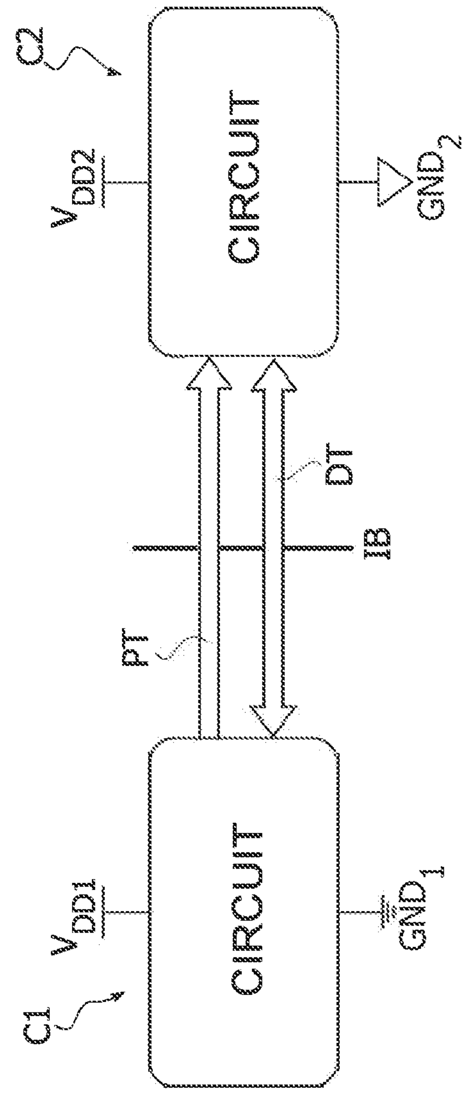
FIG. 1 is generally illustrative of communication between two circuits using a galvanic isolation barrier.

FIG. 1 is generally illustrative of communication between two circuits C1 and C2 using a galvanic isolation barrier IB (a transformer, for instance).

As illustrated, the first circuit C1 has a supply voltage $V_{DD1}$ and a (first) ground $GND_1$; the second circuit C2 has a supply voltage $V_{DD2}$ and a (second) ground $GND_2$. The voltage $V_{DD1}$ may be different from the voltage $V_{DD2}$ and the ground $GND_1$ may be different from the ground $GND_2$, with possible ground shifts.

Communication as represented by the arrows can involve power transfer PT (e.g., from the circuit C1 to the circuit C2) and/or data transfer DT (e.g., from the circuit C1 to the circuit C2 and vice-versa).

The circuit C1 may comprise, just by way of example, human/data interfaces, bus/network controllers, microcontroller units (MCUs).

The circuit C2 may comprise, again just by way of example, sensor interfaces, gate drivers, intelligent power switches medical devices, a communication network.

Again, merely by way of example, a single-channel galvanic isolated gate driver can be used across a range of switching topologies to control power switches such as silicon-carbide (SiC) or silicon MOSFET transistors and IGBT insulated-gate bipolar transistors.

Figure 2:
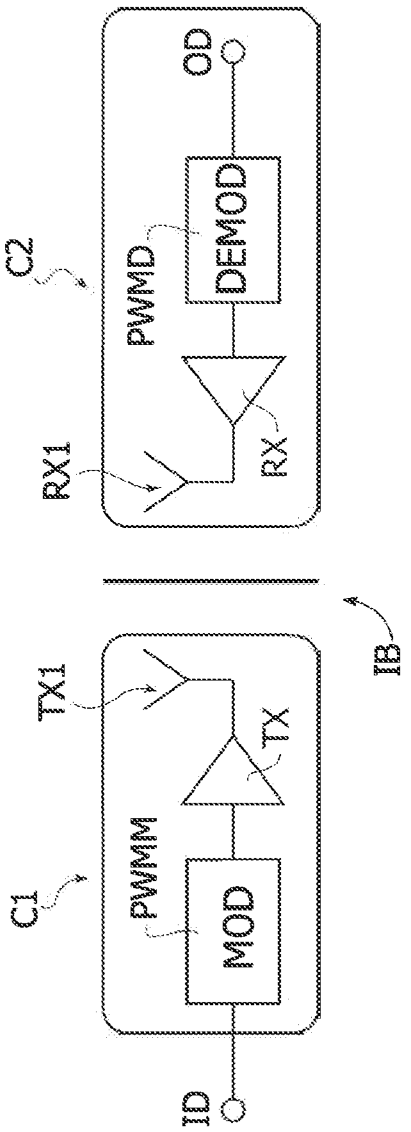
FIG. 2 is illustrative of a possible context of application of solutions as described herein.

FIG. 2 is illustrative of a possible context of application of solutions as described herein, wherein the circuits C1 and C2 are (integrated circuit) semiconductor chips or dice and communication between the two chips C1 and C2 involves transmitting input data ID from the chip C1 towards the chip C2 to be recovered as output data OD. As noted, this is just a non-limiting example in so far as communication between the two chips C1 and C2 may involve transmitting data ID from the chip C2 towards the chip C1, or communication in both directions.

In the following, transmission from the chip C1 towards the chip C2 will be referred to throughout for the sake of simplicity in order to avoid making the description unduly complicated.

Transmission as exemplified herein involves applying input data ID to a modulator (MOD) (e.g., a pulse-width modulator) PWMM to produce a PWM-modulated signal that is applied to a transmitter TX for transmission via transmitter (micro)antenna TX1.

The transmitted signal is received via a receiver RX coupled to a receiver (micro)antenna RX1 to and transferred as a pulse-width modulated (PWM) signal to a demodulator (DEMOD) (e.g., a pulse-width demodulator) PWMD to produce output data OD.

In certain applications as discussed in the following (these may be in the automotive sector, for instance) such an output PWM signal $PWM_{OUT}$ can be used to drive an electronic switch such as, e.g., a power MOSFET transistor.

Various approaches (a transformer approach, a capacitive approach, an opto-coupler approach) can be resorted to in order to implement an arrangement as exemplified in FIG. 2.

Solutions as described herein can be advantageously incorporated to the receiver RX as discussed in the following. To that effect, reinforced galvanic isolation interfaces (e.g., 10 kV) not bound to a specific integration technology is desirable.

Figure 3:
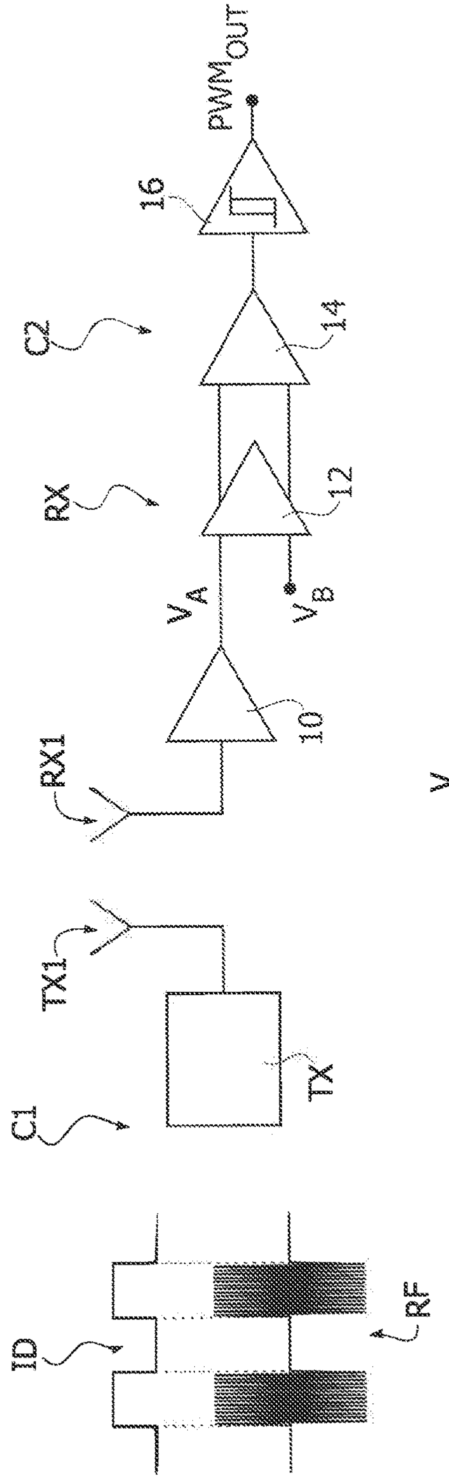
FIG. 3 is illustrative of inter-chip data communication.

FIG. 3 further illustrates inter-chip data communication under the, non-limiting, assumption that the input signal ID is a baseband binary signal that on-off modulates a radio-frequency carrier signal RF.

As illustrated in FIG. 3, the receiver RX comprises an envelope detector 10 coupled to the receiver antenna RX1.

Figure 4:
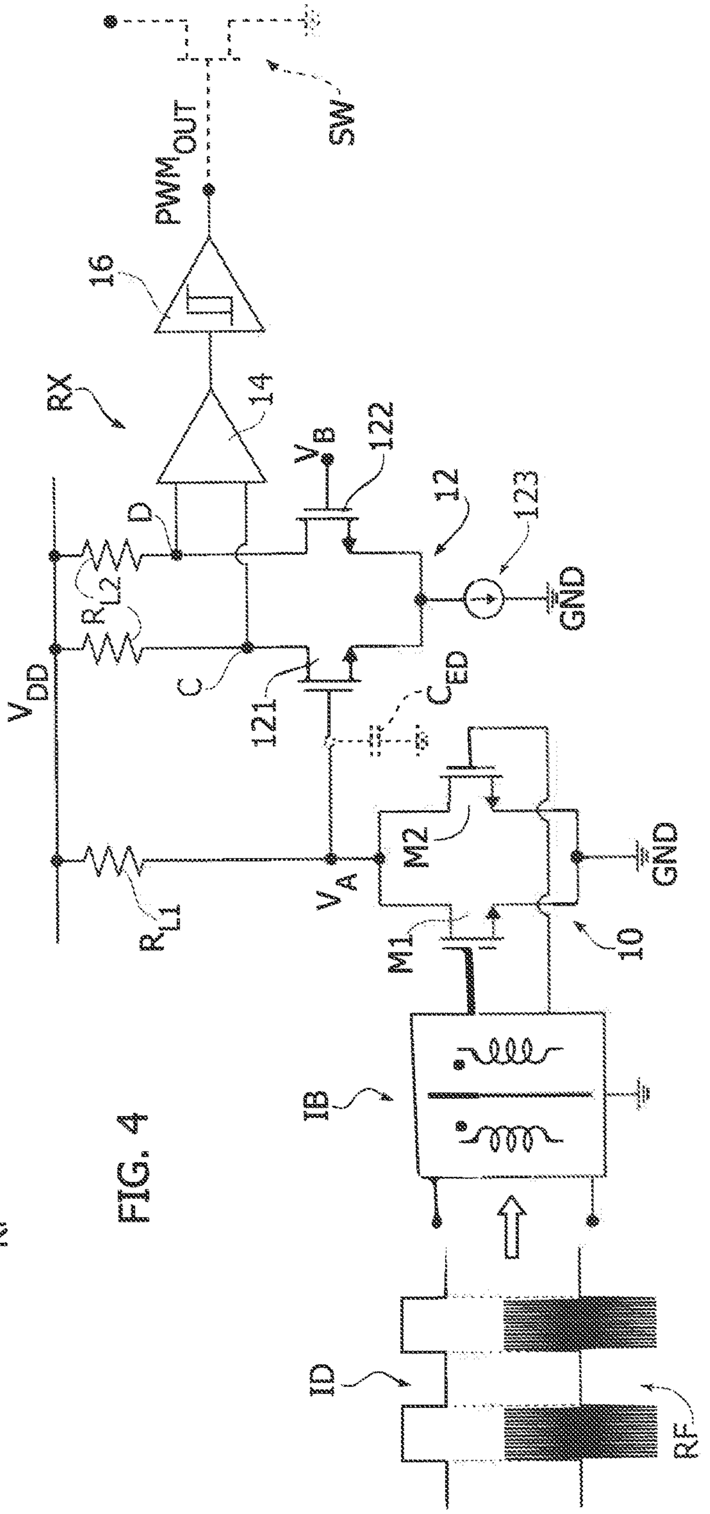
FIG. 4 is an exemplary diagram of a receiver circuit for on-off keying (OOK) modulation.

FIG. 4 shows an envelope detector 10 implemented via two MOSFET transistors M1, M2 having their control terminals (gates, in the case of field-effect transistors such as MOSFETs) coupled to the galvanic barrier IB (e.g., across the secondary winding of a transformer providing the galvanic barrier IB) and the current flow paths therethrough (source-drain, in the case of a field-effect transistors such as MOSFETs) arranged in parallel in a current flow line between a supply line at a voltage $V_{DD}$ and ground GND.

In certain embodiments, the flow of common-mode transient immunity (CMTI) currents towards ground can be facilitated by coupling the receiver RX in an AC (alternating current) mode to the antenna RX1 via two decoupling capacitances while a central socket of the antenna is connected to ground.

As illustrated in FIG. 4, a resistor RL1 is arranged between the supply line $V_{DD}$ and the parallel connection of the current flow paths through the MOSFET transistors M1, M2 with an envelope voltage $V_A$ available at a corresponding node between the resistor RL1 and the MOSFET transistors M1, M2. Advantageously, a capacitor $C_{ED}$ (shown in dashed lines) is coupled between the node $V_A$ and ground (or between the node $V_A$ and the line $V_{DD}$) to remove residues of the RF carrier from the signal obtained from the envelope detector 10.

The one exemplified here (this also applies to the discussion of FIG. 6 that follows) otherwise represents just one of a plurality of possible implementations of an envelope detector known to those of skill in the art that may resorted to within the framework of a solution as discussed herein.

Turning back to the more general representation of FIG. 3, the envelope detector 10 (however implemented) is coupled to a first input (node $V_A$) of a differential amplifier 12 having a second input at a node $V_B$.

As illustrated, the output from the differential amplifier 12 is coupled (e.g., via a further amplifier 14 providing additional gain) to a (hysteresis) comparator 16 whose output is a PWM-modulated signal $PWM_{OUT}$ suited to drive a load, e.g., to on-off turn an electronic switch SW such as a power MOSFET transistor.

It is noted that the load (e.g., the switch SW) is usually a distinct element from the embodiments.

In inter-chip data communication as illustrated in FIG. 3 two micro-antennas TX1, RX1 are used to transmit a modulated RF carrier between two chips C1 and C2.

The low-level RF signal at the receiver is thus rectified (at the envelope detector 10) and then amplified (at the gain stages 12 and 14) to be applied to a hysteresis comparator 16 to provide an output PWM signal $PWM_{OUT}$.

An offset voltage between the two nodes $V_A$, $V_B$ (the inputs to the amplifier 12) can adversely affect an even compromise a correct recovery of the PWM signal. Applying an offset compensation technique to compensate that offset voltage thus facilitates accurate demodulation of the PWM signal.

A related offset compensation circuit should desirably operate not only at start-up and standby conditions but also during operation in so far as this facilitates compensating offset drift effects.

FIG. 4, already partly discussed, illustrates an exemplary diagram of a receiver circuit for on-off keying, OOK modulation, where the galvanic barrier IB is illustrated implemented as a transformer, and the envelope detector 10 is implemented via two MOSFET transistors M1, M2 having their control terminals (gates, in the case of field-effect transistors such as MOSFETs) coupled to the galvanic barrier IB (across the secondary winding of the transformer) and the current flow paths therethrough (source-drain, in the case of a field-effect transistors such as MOSFETs) arranged in parallel in a current flow line between a supply line at a voltage $V_{DD}$ and ground GND.

As noted, a resistor $R_{L1}$ is arranged between the supply line $V_{DD}$ and the parallel connection of the current flow paths through the MOSFET transistors M1, M2, with the capacitor $C_{ED}$ (shown in dashed lines) coupled between the node $V_A$ and ground (or the line $V_{DD}$) to remove residues of the RF carrier from the signal from the envelope detector 10.

The envelope signal $V_A$ between the resistor RL1 and the MOSFET transistors M1, M2 is applied to the input of the first amplifier stage 12 that comprises a differential pair of two (e.g., MOSFET) transistors 121, 122 having their control terminals (gates, in the case of field-effect transistors such as MOSFETs) coupled to receive the envelope signal $V_A$ (at the control terminal of the transistor 121) and a reference signal $V_B$ (at the control terminal of the transistor 122).

A tail current generator 123 is provided between the transistors 121, 122 and ground GND to be traversed by a current flowing through the parallel-connected current flow paths therethrough (source-drain, in the case of a field-effect transistors such as MOSFETs) through the transistors 121, 122.

Two resistors (both referenced as $R_{L2}$) are arranged coupled each between the supply line $V_{DD}$ and: a node C at the current flow path through the transistor 121, and a node D at the current flow path through the transistor 122.

The output from the amplifier stage 12 is obtained as a differential signal between the nodes C and D and applied to the (differential) gain stage 14 to be then delivered to the input of the hysteresis comparator 16 that produces the output signal $PWM_{OUT}$ the original PWM signal.

Various approaches can be considered for countering undesired offsets in a receiver as discussed previously.

A first approach may involve manual trimming using metal or "poly" fuses (eFuses). For instance, such fuses can replace the switches in the resistive string $R_{L2}$ in FIG. 4. Such an approach inevitably results in increase of the cost of in production testing. Also, high currents may be involved in blowing the fuse.

Another approach may involve using a floating gate MOSFET transistor to implement an analog trim-voltage memory (ATVM). Such an ATVM can be used for trimming offset voltages and currents resulting from threshold mismatches in analog circuits such as operational amplifiers and comparators. It can be incorporated into a standard digital CMOS process without additional processing steps as those currently involved in EEPROM fabrication. However, it still involves the non-negligible provision of additional elements.

Still another approach may involve using a one-time programmable (OTP) non-volatile memory (NVM) such an e-fuse or antifuse to replace floating-gate or e-fuse techniques as used in analog/sensor trimming and calibration. Macros of the OTP type offer a good deal of security, reliability and flexibility as desirable to cost-effectively implement analog trimming and calibrate operations in consumer, automotive and mobile communication devices (ADC, receivers etc.). Also, die area occupation of an OTP element is small, and this reduces cost.

A drawback of this approach lies in the need for an initial programming phase either after chip packaging or by the user.

A still further approach may involve digital offset cancellation in a self-calibration technique: this approach is not able to support satisfactorily various operation phases such as start-up, working (operation proper) and standby as desirable for gate drivers. Applications with higher PWM rates (e.g., PWM rates higher than 400 KHz) are not compatible with PWM data transmission.

In solution as described herein an offset compensation solution is proposed based on a mixed analog/digital offset compensation strategy that is capable of tracking process, voltage and temperature (PVT) variations during different operating conditions, e.g., start-up, working, and standby conditions.

Figure 5:
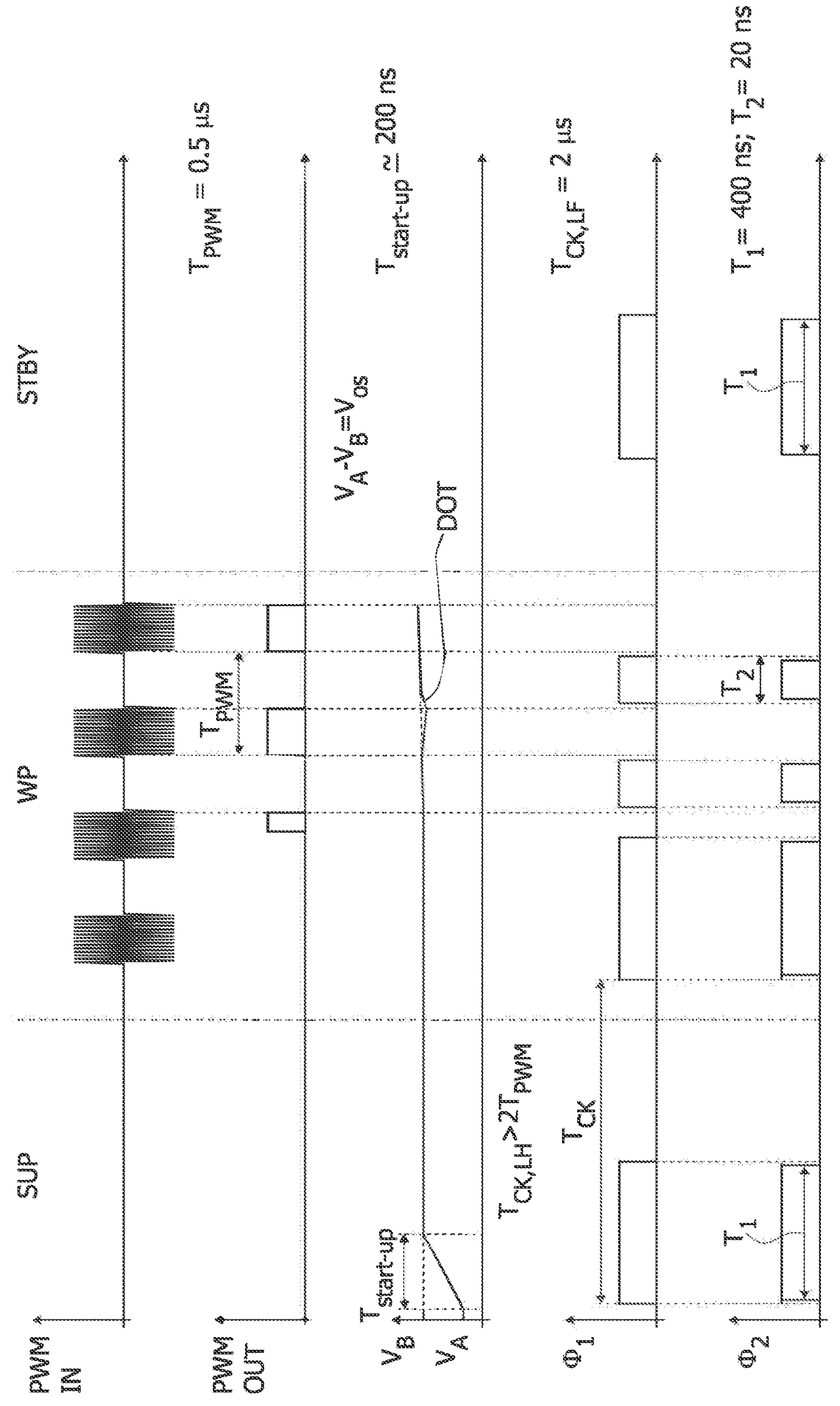
FIG. 5 is a diagram showing possible time behaviors of signals that may occur in a receiver circuit for OOK modulation as described herein.

FIG. 5 is a diagram showing, with reference to a common time (abscissa) scale, possible time behaviors of signals that may occur in a receiver circuit for OOK modulation.

More specifically, FIG. 5 is a diagram showing possible time behaviors of the following signals (from top to bottom): a PWM input signal PWM IN (modulated onto a RF carrier); a corresponding PWM output signal $PWM_{OUT}$; a possible offset signal $V_{OS}=V_A-V_B$ between the nodes $V_A$ and $V_B$; and two compensation control signals $\Phi_1$ and $\Phi_2$ produced as discussed in the following.

Specifically, possible time behaviors of the signals identified above are shown (from left to right) with reference to three different phases: a start-up phase SUP, without any PWM signal assumed to be applied to the receiver; a working phase WP, with a PWM (e.g., data) signal assumed to be applied to the receiver; and a stand-by phase STBY, again without any PWM signal assumed to be applied.

Merely by way of example (and without limitations for the embodiments) a period $T_{PWM}$ of the PWM signal equal to 0.5 microseconds can be considered in connection with a start-up time $T_{start-up}$ (the time for the signal $V_B$ to initially reach the signal $V_A$) of 200 nanoseconds.

A dynamic offset compensation DOT (of a duration of about 20 nanoseconds) is shown in the curve for the possible offset signal $V_{OS}=V_A-V_B$.

The times $T_1$ (e.g., 400 nanoseconds) and $T_2$ (e.g., 20 nanoseconds) are shown in the two lowermost curves of FIG. 5 for the two signals $\Phi_1$ and $\Phi_2$.

A time $T_{CK,LF}$ such that $T_{CK,LF}>2T_{PWM}$ (e.g. $T_{CK,LF}$ equal to 2 microseconds) is also illustrated in connection with the clock signal $V_{CK,LF}$ as discussed in FIG. 7.

All of the quantitative figures referred to in the foregoing are merely exemplary and non-limiting: they are given primarily with the aim of elucidating certain relationships that may exist between the durations of various signals discussed herein.

Figure 6:
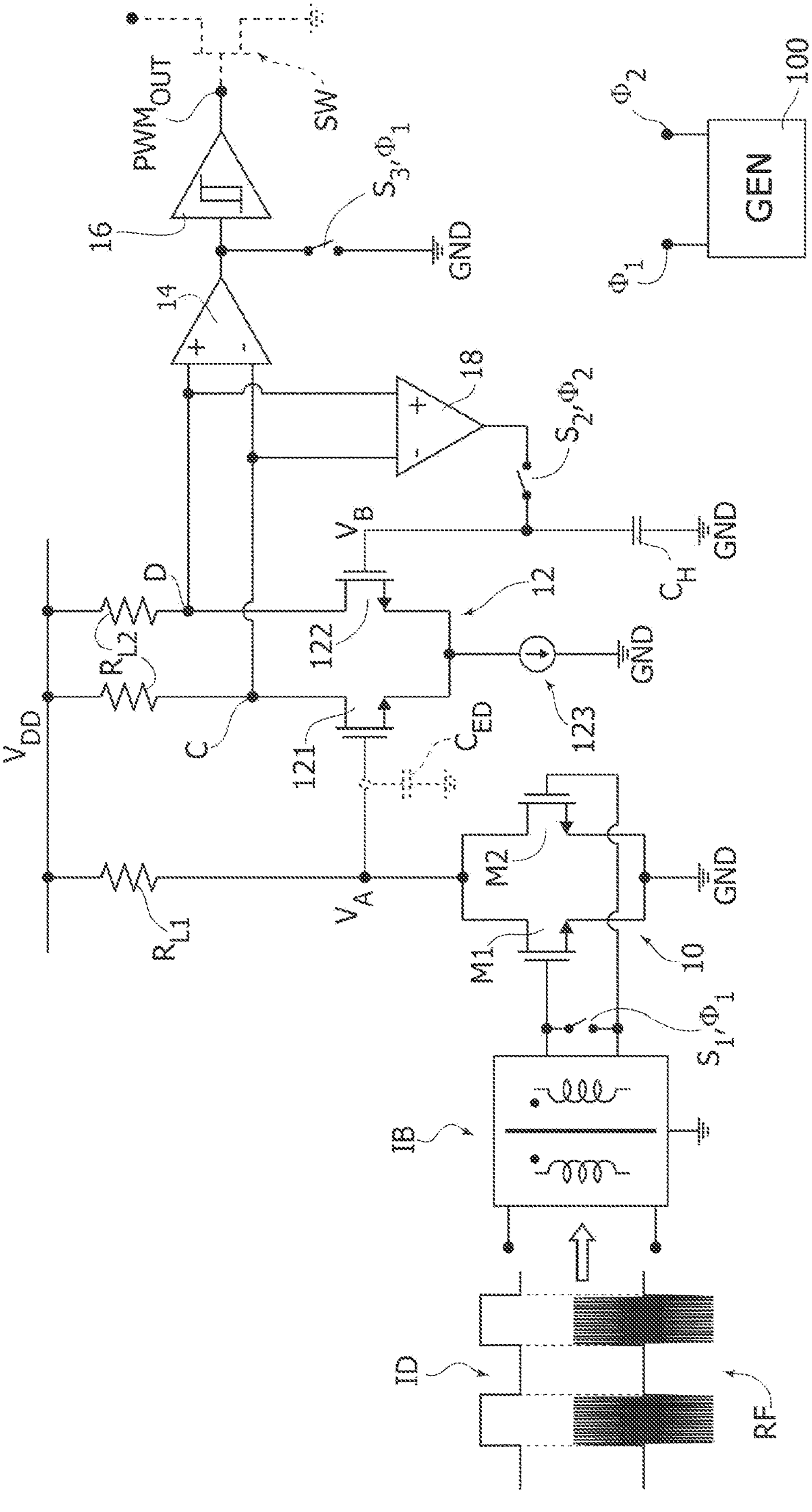
FIG. 6 is an exemplary diagram of a receiver circuit.

FIG. 6 is exemplary of an arrangement as presented in FIG. 4 that is capable of operating adequately in (all of) the three operating phases SUP, WP and STBY presented in FIG. 5.

In FIG. 6, parts or elements like parts or elements already discussed in connection with FIG. 4 are indicated with like reference numbers/symbols and a corresponding detailed description will not be repeated for brevity.

Also, like parts or elements being indicated with like reference numbers/symbols in FIG. 4 and FIG. 6 does not imply that these parts or elements need be implemented in the same manner in in both cases.

To summarize, the circuit illustrated in FIG. 6 comprises: an envelope detector M1, M2, $R_{L1}$, $C_{ED}$ configured to receive (via the antenna RX1) an on-off keying, OOK signal modulated over a radiofrequency, RF carrier and remove therefrom the RF carrier; and a differential stage 121, 122, $R_{L2}$ having a first input $V_A$ coupled to the envelope detector M1, M2, RL1, $C_{ED}$ and a second input $V_B$ configured to receive a reference signal.

As illustrated, the differential stage 121, 122, $R_{L2}$ has first C and second D output nodes configured to produce across them a replica of the OOK signal having the RF carrier removed therefrom.

As illustrated, the circuit in FIG. 6 comprises a comparator 16 coupled (e.g., via a gain stage 14) to the first C and second D output nodes of the differential stage 121, 122, $R_{L2}$ and configured to produce, based on the replica of the OOK signal having the RF carrier removed therefrom, a PWM-modulated signal $PWM_{OUT}$ having on and off times.

Comparing the circuit diagram of FIG. 6 with the circuit diagram of FIG. 4 shows that, in the circuit diagram of FIG. 6: a capacitor $C_H$ is coupled between the node $V_B$ (control terminal of the transistor 122) and ground GND; and a differential amplifier 18 is optionally coupled with its inputs (inverting "−" and non-inverting "+") coupled to the nodes C and D to provide additional (loop) gain to the difference between the voltages at these nodes (offset compensation as discussed in the following involves feeding this difference back to the node $V_B$ targeting a zero value).

Comparing the circuit diagram of FIG. 6 with the circuit diagram of FIG. 4 also shows that, in the circuit diagram of FIG. 6 three switches $S_1$, $\Phi_1$, $S_2$, $\Phi_2$ and $S_3$, $\Phi_1$ (e.g., electronic switches such as MOSFET transistors) are provided configured, when "on" (that is when made conductive): to short-circuit the output from the isolation barrier, namely the input to the envelope detector 10 (transistors M1, M2) of the receiver (switch $S_1$, $\Phi_1$—driven via the signal $\Phi_1$); to couple the node $V_B$ (that is the capacitor $C_H$) to the output from the amplifier 18 to apply there to a signal indicative of the difference between the voltages at the nodes C and D (switch $S_2$, $\Phi_2$—driven via the signal $\Phi_2$); and to short towards ground GND the line coupling the amplifier 14 and the hysteresis comparator 16 (switch $S_3$, $\Phi_1$—driven via the signal $\Phi_1$).

Operation (on-off switching) the switches $S_1$, $\Phi_1$, $S_2$, $\Phi_2$ and $S_3$, $\Phi_1$ is controlled via the signals $\Phi_1$ and $\Phi_2$. These signals can be produced via a signal generator (GEN) 100 as illustrated in the diagram of FIG. 7.

It is noted that the switches $S_1$, $\Phi_1$ and $S_3$, $\Phi_1$ are controlled via the signal $\Phi_1$, while the switch $S_2$, $\Phi_2$ is controlled via the signal $\Phi_2$.

It is otherwise noted that (as visible in the two lowermost curves in the diagram of FIG. 5) the signals $\Phi_1$ and $\Phi_2$ have corresponding time behaviors (that is, essentially the same time behavior) with the exception that the signal $\Phi_2$ has: rising edges (slightly) lagging (i.e., following) the rising edges of the signal $\Phi_1$, and falling edges (slightly) preceding (i.e., anticipating) the falling edges of the signal $\Phi_1$.

This kind of "dis-overlapping" advantageously counters undesired effects of the transmitted PWM signal on offset compensation, e.g., facilitating the PWM signal in being at a "low" level (switch SW turned off) during offset compensation.

Undesired inaccuracies in offset compensation during the start-up (SUP) and standby (STBY) phases are countered in so far the receiver input is short-circuited by the switch $S_1$, $\Phi_1$ and the input to the comparator 16 is forced to zero (GND) by the switch $S_3$, $\Phi_1$ so that no PWM signal (and also no input noise) propagates through the receiver. Also, offset compensation during the working phase (WP), when a PWM signal is expected to propagate through the receiver, is affected during the "off" times of the PWM signal, that is when the PWM signal is at zero level.

The arrangement of FIG. 6 is thus exemplary of a compensation loop that exploits the first amplifier of the receiving chain (transistors M1 and M2) as an input stage and the second stage (transistors 121, 122) to increase gain.

Such an arrangement is advantageous, e.g., with GaN technologies that have offsets (much) higher than CMOS technologies and deserve not to be neglected with respect to typical variations in the bias voltage $V_A$.

Advantageously, the arrangement of FIG. 6 (and FIG. 7) facilitates dynamic adaptative operation that uses two timing (clock) signals, one of which is synchronized to the PWM signal, with two compensation time slots.

As illustrated herein, this result is facilitated by a mixed analog/digital compensation approach, which combines analog compensation and digital control.

A possible implementation of the generator 100 (this may be either a distinct circuit or be incorporated to a single circuit with the receiver of FIG. 6) is built around three D-type flip-flops 101, 102, and 103.

The two first flip-flops 101, 102 are clocked via a clock signal $V_{CK,LF}$ (generated with a clock generator CLK of any type known to those of skill in the art, e.g., a ring oscillator: this may possible be a distinct element from the embodiments) with a period $T_{CK,LF}$ such that $T_{CK,LF}>2T_{PWM}$ as illustrated in the diagram of FIG. 5.

The third flip-flop 103 is clocked via the PWM signal $PWM_{OUT}$ from the comparator 16 (logically inverted at an inverter 104) or any other signal synchronous with such a PWM signal. Essentially, as discussed in the following, the signal $V_{CK,LF}$ can be regarded as a (e.g., square wave) signal that is "slow" with respect to the PWM signal.

Figure 7:
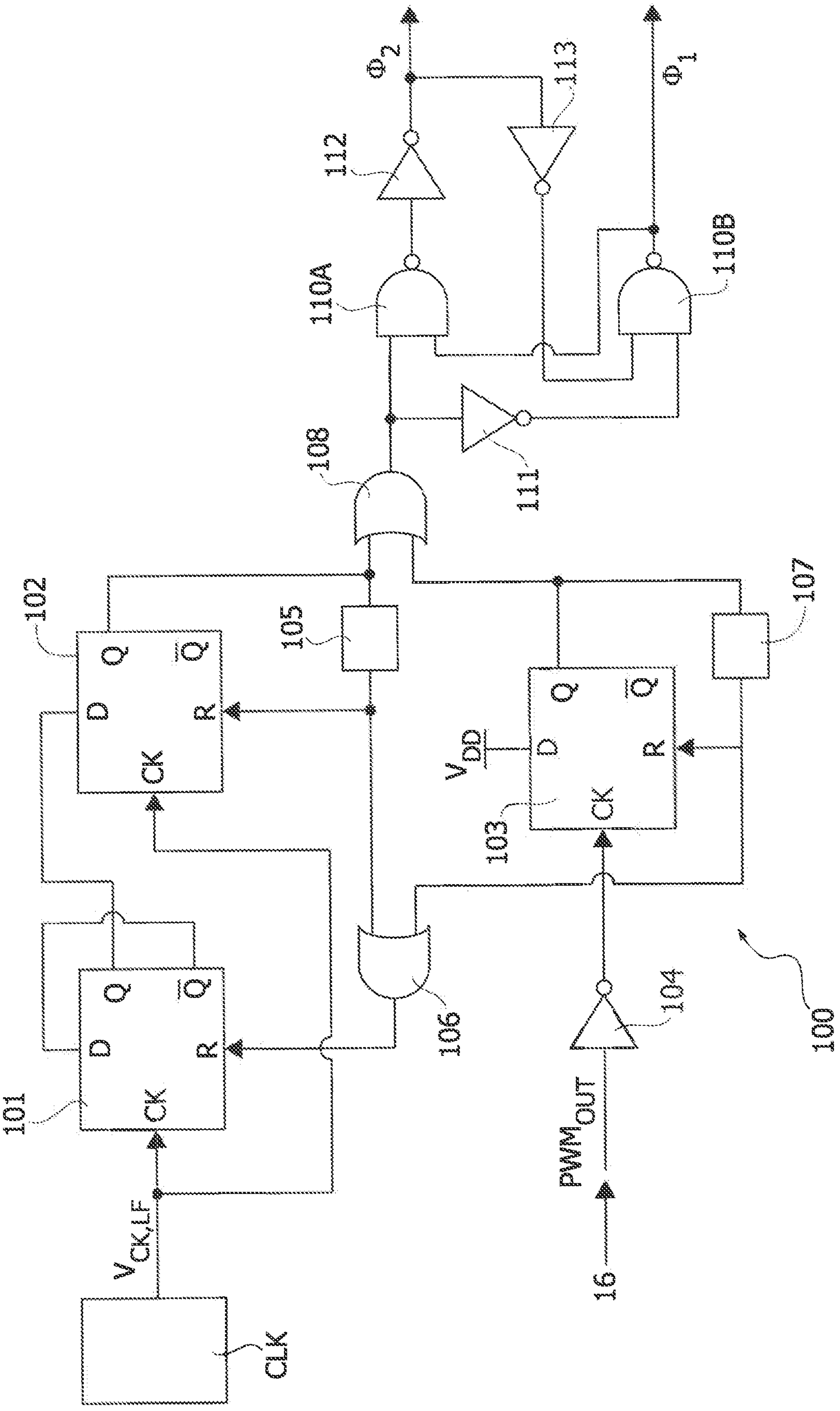
FIG. 7 is a circuit diagram of a digital control circuit.

As illustrated in FIG. 7: the first flip-flop 101 is arranged with its (negated) Q output coupled to its D input and the Q output coupled to the D input to the second flip-flop 102; the Q output from the second flip-flop 102 is fed back via a (first) delay block 105 to the reset input R of the second flip-flop 102 and to a first input of a (first) OR gate 106 that drives the reset input R of the first flip-flop 101; the third flip-flop 103 is arranged with its D input set to the supply voltage VDD and the Q output fed back via a (second) delay block 107 to the reset input R of the third flip-flop 103 and to the other input of the OR gate 106 that drives the reset input R of the first flip-flop 101; the Q outputs of the second and third flip-flops 102 and 103 are applied to the inputs of a (second) OR gate 108, whose output drives a pair of NAND gates 110A, 110B; the first NAND gate 110A receives, on a first input, the output of the OR gate 108 and, on a second input, the output of the second of NAND gate 110B; and the second NAND gate 110B receives, on a first input, the output of the OR gate 108 logically inverted at an inverter 111 and, on a second input, the output of the first NAND gate 110A (as obtained via two complementary logical inversions at two inverters 112 and 113.

The delay blocks 105 and 107 thus dictate the characteristics of the signals $\Phi_1$ and $\Phi_2$ (primarily the durations of the intervals $T_1$ and $T_2$).

As noted, the one illustrated in FIG. 7 is only one exemplary implementation of a signal generator 100 configured to provide the signals $\Phi_1$ (at the output of the second NAND gate 110B) and $\Phi_2$ (at the output of the first NAND gate 110A after logical inversion at the inverter 112), namely two slightly "dis-overlapped" replicas $\Phi_1$ and $\Phi_2$ of a same signal in order to counter undesired effects of the transmitted PWM signal on offset compensation: other implementations are within the ability of those of skill in the art.

To summarize, the one illustrated in FIG. 7 is an exemplary implementation of a signal generator 100 configured provide signals $\Phi_1$ and $\Phi_2$ that make the first switch $S_1$, $\Phi_1$, the second switch $S_2$, $\Phi_2$ and the third switch $S_3$, $\Phi_1$ conductive during the start-up phase SUP and (at least one) standby phase STBY for a time $T_1$ longer than the off times $T_2$ of the PWM-modulated signal.

In the examples considered herein the PWM-modulated signal $PWM_{OUT2}$ has a period (e.g., $T_{PWM}$=0.5 microseconds) and the logic circuitry 100 is configured to make the first switch $S_1$, $\Phi_1$, the second switch $S_2$, $\Phi_2$ and the third switch $S_3$, $\Phi_1$ conductive during the start-up and standby phases for a time $T_1$ (e.g., 400 nanoseconds) that is at least one order of magnitude (that, is at least ten times) longer than the off times $T_2$ (e.g., 20 nanoseconds) of the PWM-modulated signal.

As exemplified in FIG. 7, the logic circuitry 100 comprises: a first branch (e.g., with the components referenced 101, 102, 105) configured to be activated during the start-up and the standby phases to make the switches $S_1$, $\Phi_1$; $S_2$, $\Phi_2$; and $S_3$, $\Phi_1$ conductive in the absence of the PWM-modulated signal $PWM_{OUT}$ as a function of a first clock signal $V_{CK,LF}$, and a second branch (e.g., with the component referenced 103, 107) configured to be activated during the working phase WP to make the switches $S_1$, $\Phi_1$; $S_2$, $\Phi_2$; and $S_3$, $\Phi_1$ conductive during off times $T_2$ of the PWM-modulated signal.

As illustrated, the circuit comprises a clock generator CLK (optionally a ring oscillator) to produce the first clock signal $V_{CK,LF}$ to activate the first branch 101, 102 of the logic circuitry 100 and make the switches $S_1$, $\Phi_1$; $S_2$, $\Phi_2$; and $S_3$, $\Phi_1$ conductive (even) in the absence of the PWM-modulated signal $PWM_{OUT}$.

As illustrated, the second branch 103, 107 of the logic circuitry 100 is coupled to the comparator 16 to receive therefrom the PWM-modulated signal $PWM_{OUT}$ to make the switches $S_1$, $\Phi_1$; $S_2$, $\Phi_2$; and $S_3$, $\Phi_1$ conductive during off times T of the PWM-modulated signal.

As illustrated, the logic circuitry 100 is configured to produce: a first drive signal $\Phi_1$ to make the first switch $S_1$, $\Phi_1$ and the third switch $S_3$, $\Phi_1$ conductive, and a second drive signal $\Phi_2$ to make the second switch $S_2$, $\Phi_2$ conductive.

As illustrated, the first signal $\Phi_1$ and the second signal $\Phi_2$ exhibit corresponding (i.e., substantially identical, but slightly dis-overlapped) time behaviors with the second signal $\Phi_2$ having rising edges lagging the rising edges of the first signal $\Phi_1$ and falling edges preceding the falling edges of the first signal $\Phi_1$.

As exemplified in the diagram of FIG. 5, operation of the arrangement of FIG. 6 (and FIG. 7) involves, during a start-up phase SUP of the receiver, the storage capacitor $C_H$ in FIG. 6 (that provides the voltage $V_B$) being charged from an initial value towards the voltage $V_A$.

As visible on the left-hand side of the diagram for the voltage $V_B$ in FIG. 5 this process takes place "slowly" (due to slewing limitations) during a first charging pulse of duration $T_1$ that represents the compensation time slot during the start-up phase SUP (and also in stand-by conditions STBY, as discussed in the following).

To that purpose, the digital circuitry (e.g., essentially the generator 100, with the PWM signal not present yet) operates at low frequency clock signal ($V_{CK,LF}$ having a frequency $f_{CK,LF}$ of, e.g., 0.5 MHz) thus providing a large (long) compensation pulse $T_1$.

During the working phase WP (center portion of FIG. 5), with the PWM signal present, the negative time slot of the PWM signal can be exploited to restore the capacitor $C_H$ and thus compensate for offset variations due to thermal drift effects.

During the working phase WP, the clock of the digital circuit is switched from the previous low-frequency clock to a clock that is extracted from the PWM signal (e.g., with a frequency $f_{PWM}$=2 MHz). A narrow pulse (about 20 ns, for instance) is then generated for dynamic offset compensation (DOT in the diagram of FIG. 5) that is suitable for the compensation even for high values for the duty cycle (e.g., 90%) when the negative time slot of the PWM signal is low (i.e., 50 ns).

It is noted that, during the working phase WP as represented in FIG. 5, the PWM signal $PWM_{OUT}$ is at first "blanked" as a result of the switches $S_1$, $\Phi_1$ and $S_3$, $\Phi_1$ being still closed by the signal Φ1.

It is noted that the highest number of PWM pulses that can be lost during compensation in the start-up and/or standby phases (SUP and STBY, respectively) due to offset compensation is equal to $f_{PWM}/2f_{CK,LF}$ (e.g., 2 in the exemplary implementation presented herein).

During the standby phase STBY (right-hand portion of FIG. 5), where the PWM signal is no longer transmitted, the clock signal is again switched to the low frequency clock. For instance, this may happen if the PWM signal is not present for a time higher than $T_{CK,LF}$.

It will be appreciated that, while a sequence of a start-up phase SUP, a working phase WP and standby phase STBY is illustrated in FIG. 5, operation of a receiver as discussed herein may involve, after a start-up phase SUP, an alternation of working phases WP and standby phases STBY depending on whether a PWM signal is transmitted or not.

It is once more noted that the highest number of PWM pulses that can be lost as a result of compensation during in the start-up and/or standby phases (SUP and STBY, respectively)—see the left-hand side of the central portion in FIG. 5, where the PWM signal is initially blanked—is equal to $f_{PWM}/2f_{CK,LF}$ (e.g., 2 in the exemplary implementation presented herein.

To summarize, a solution as proposed herein comprises offset compensation circuitry including: a first switch $S_1$, $\Phi_1$ operable to be made conductive to short-circuit the input to the envelope detector M1, M2, $R_{L1}$, $C_{ED}$; a storage capacitor $C_H$ coupled to the second input $V_B$ of the differential stage 121, 122, $R_{L2}$; a second switch $S_2$, $\Phi_2$ operable to be made conductive to feed back to the storage capacitor $C_H$ a signal (e.g., from the differential stage 18) indicative of the difference between the first output node C and the second D output node of the differential stage 121, 122, $R_{L2}$; and a third switch $S_3$, $\Phi_1$ operable to be made conductive to short-circuit the input to the comparator 16.

The logic circuitry 100 as exemplified in FIG. 7 is configured to activate the offset compensation circuitry in a sequence of phases comprising, in the first place a start-up phase SUP where the switches $S_1$, $\Phi_1$; $S_2$, $\Phi_2$; and $S_3$, $\Phi_1$ are made conductive in the absence of the PWM-modulated signal $PWM_{OUT}$.

Once the start-up phase completed, the logic circuitry 100 as exemplified in FIG. 7 is configured to activate a working phase WP in the presence of the PWM-modulated signal $PWM_{OUT}$ where the switches $S_1$, $\Phi_1$; $S_2$, $\Phi_2$; and $S_3$, $\Phi_1$ are made conductive during off times T of the PWM-modulated signal $PWM_{OUT}$.

A standby phase STBY may then follow where the switches $S_1$, $\Phi_1$; $S_2$, $\Phi_2$; and $S_3$, $\Phi_1$ are again made conductive in the absence of the PWM-modulated signal $PWM_{OUT}$, with the circuit returning from the standby phase to working phase in response to a PWM (OOK) signal being again received via the antenna RX1. Consequently, the working phase WP can be regarded as a phase alternating with the start-up phase SUP and/or at least one standby phase STBY.

As discussed, a (further) differential stage 18 can be advantageously coupled across the first output node C and the second D output node of the differential stage 121, 122, $R_{L2}$ to apply a (loop) gain to the signal indicative of the difference between the first output node C and the second output node D of the differential stage 121, 122, $R_{L2}$ that is fed back to the storage capacitor $C_H$. This option is found to facilitate proper operation of the compensation loop with the target of keeping at zero the difference of the voltages at the nodes C and D.

As discussed, a (further) gain stage 14 is optionally arranged between the differential stage 121, 122, $R_{L2}$ and the comparator 16 with the purpose of applying a (transfer) gain to the replica of the OOK signal having the RF carrier removed that is applied to the comparator 16 to produce the PWM-modulated signal $PWM_{OUT}$.

This option is found to facilitate proper operation of the comparator in the presence of small (weak) input signals to the receiver.

A solution as proposed herein is able to operate adequately in (all of) the three operating phases SUP, WP, and STBY illustrated in the diagram of FIG. 5. This result is facilitated by the use of two clock signals (one of which is synchronized to the transmitted signal) and two compensation time slots.

The claims are an integral part of the technical teaching provided in respect of the embodiments.

Without prejudice to the underlying principles, the details and embodiments may vary, even significantly, with respect to what has been described by way of example only without departing from the extent of protection. The extent of protection is determined by the annexed claims.

The invention claimed is:

1. A circuit, comprising:

an envelope detector configured to receive a modulated signal over a radiofrequency (RF) carrier at an input and to remove the RF carrier;

a differential stage having a first input coupled to an output of the envelope detector and a second input configured to receive a reference signal, the differential stage having first and second output nodes configured to produce therebetween a replica of the modulated signal having the RF carrier removed therefrom;

a comparator coupled to the first and second output nodes of the differential stage, respectively, said comparator configured to produce, based on said replica of the modulated signal having the RF carrier removed therefrom, a PWM-modulated signal having on and off times;

offset compensation circuitry including a first switch configured when made conductive to short-circuit the input to the envelope detector, a storage capacitor coupled to the second input of the differential stage, a second switch configured when made conductive to feed back to the storage capacitor a signal indicative of a difference between the first output node and the second output node of the differential stage, and a third switch configured when made conductive to short-circuit an input to the comparator; and logic circuitry configured to activate the offset compensation circuitry in a sequence of phases comprising:

a start-up phase and at least one standby phase wherein the first switch, the second switch and the third switch are made conductive in the absence of the PWM-modulated signal, and a working phase alternating with the start-up phase or at least one standby phase in the presence of the PWM-modulated signal wherein the first switch, the second switch and the third switch are made conductive during off times of the PWM-modulated signal.

2. The circuit of claim 1, wherein the modulated signal is an on-off keying (OOK) modulated signal.

3. The circuit of claim 1, wherein the logic circuitry is configured to make the first switch, the second switch and the third switch conductive during the start-up phase and the at least one standby phase for a time longer than the off times of the PWM-modulated signal.

4. The circuit of claim 3, wherein the PWM-modulated signal has a period and the logic circuitry is configured to make the first switch, the second switch and the third switch conductive during the start-up phase and the at least one standby phase for a time at least one order of magnitude longer than the off times of the PWM-modulated signal.

5. The circuit of claim 1, wherein the logic circuitry comprises:

a first branch configured to be activated during the start-up phase and the at least one standby phase to make the first switch, the second switch and the third switch conductive in the absence of the PWM-modulated signal as a function of a first clock signal; and a second branch configured to be activated during the working phase to make the first switch, the second switch and the third switch conductive during off times of the PWM-modulated signal.

6. The circuit of claim 5, wherein the circuit comprises a clock generator configured to produce the first clock signal.

7. The circuit of claim 5, wherein the second branch of the logic circuitry is coupled to said comparator to receive therefrom said PWM-modulated signal to make the first switch, the second switch and the third switch conductive during off times of the PWM-modulated signal.

8. The circuit of claim 1, wherein:

the logic circuitry is configured to produce a first drive signal to make the first switch and the third switch conductive and a second drive signal to make the second switch conductive; and the first signal and the second signal have corresponding time behaviors with the second signal having rising edges lagging the rising edges of the first signal and falling edges preceding the falling edges of the first signal.

9. The circuit of claim 1, further comprising:

a further differential stage coupled to the first output node and the second output node of the differential stage and configured to apply a loop gain to the signal indicative of the difference between the first output node and the second output node of the differential stage fed back to the storage capacitor in response to the second switch being made conductive.

10. The circuit of claim 1, further comprising:

a gain stage arranged between the differential stage and the comparator configured to apply a transfer gain to said replica of the modulated signal having the RF carrier removed therefrom applied to the comparator to produce the PWM-modulated signal having on and off times.

11. The circuit of claim 1, further comprising an electronic switch coupled to said comparator and configured to be driven as a function of said PWM-modulated signal.

12. A system, comprising:

a plurality of semiconductor chips configured to communicate via a modulated signal over a radiofrequency (RF) carrier, wherein at least one of the chips in the plurality comprises the circuit according to claim 1 with said envelope detector configured to receive said modulated signal.

13. A method, comprising:

receiving a modulated signal over a radiofrequency (RF) carrier;

removing said RF carrier with an envelope detector;

producing a replica of the modulated signal having the RF carrier removed therefrom between first and second output nodes of a differential stage having a first input coupled to the envelope detector and a second input configured to receive a reference signal;

producing, via a comparator coupled to the first and second output nodes of the differential stage, a PWM-modulated signal having on and off times based on said replica of the modulated signal having the RF carrier removed therefrom;

actuating a first switch to short-circuit the input to the envelope detector;

actuating a second switch to feed back to a storage capacitor coupled to the second input of the differential stage a signal indicative of the difference between the first output node and the second output node of the differential stage;

actuating a third switch to short-circuit the input to the comparator; and activate a sequence of offset compensation phases comprising:

a start-up phase and at least one standby phase where the first switch, the second switch and the third switch are actuated in the absence of the PWM-modulated signal; and a working phase alternating with the start-up phase or the at least one standby phase in the presence of the PWM-modulated signal wherein the first switch, the second switch and the third switch are actuated during off times of the PWM-modulated signal.

14. A circuit, comprising:

an envelope detector having a first input, a second input and an output;

a first differential amplifier having a first input coupled to the output of the envelope detector, a second input coupled to receive a reference voltage, a first output and a second output;

a second differential amplifier having a first input coupled to the first output of the first differential amplifier, a second input coupled to the second output of the first differential amplifier, and an output;

a comparator having a first input coupled to the first output of the first differential amplifier, a second input coupled to the second output of the first differential amplifier, and an output from which a pulse width modulation (PWM) signal having on and off times is generated; and offset compensation circuitry comprising:

a first switch configured to selectively short the first input and second input of the envelope detector;

a second switch configured to selectively connect the output of the second differential amplifier to the second input of the first differential amplifier; and a third switch configured to selectively ground the output of the comparator.

15. The circuit of claim 14, further comprising logic circuitry configured to selectively actuate the first, second and third switches of the offset compensation circuitry in a sequence of phases.

16. The circuit of claim 15, wherein said sequence of phases comprises:

a start-up phase wherein the first, second and third switches are actuated in the absence of the PWM signal; and a working phase alternating with the start-up phase in the presence of the PWM signal wherein the first, second and third switches are actuated only during off times of the PWM signal.

17. The circuit of claim 15, wherein said sequence of phases comprises:

a standby phase wherein the first, second and third switches are actuated in the absence of the PWM signal; and a working phase alternating with the start-up phase in the presence of the PWM signal wherein the first, second and third switches are actuated only during off times of the PWM signal.

18. The circuit of claim 15, wherein the logic circuitry comprises:

a first branch configured to be activated during a start-up phase and a standby phase to actuate the first, second and third switches in the absence of the PWM signal as a function of a first clock signal; and a second branch configured to be activated during a working phase to actuate the first, second and third switches during off times of the PWM signal.

19. The circuit of claim 14, wherein the first and second inputs of the envelope detector are configured to receive a modulated signal over a radiofrequency (RF) carrier.

* * * * *